(12) United States Patent
Tachikawa et al.

(10) Patent No.: US 7,294,452 B2
(45) Date of Patent: Nov. 13, 2007

(54) LIGHT EMITTING ELEMENT AND PROCESS FOR PRODUCING THE SAME

(75) Inventors: Tomoyuki Tachikawa, Shinjuku-Ku (JP); Norihito Itoh, Shinjuku-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 11/100,317

(22) Filed: Apr. 6, 2005

(65) Prior Publication Data

US 2005/0255256 A1 Nov. 17, 2005

(30) Foreign Application Priority Data

Apr. 7, 2004 (JP) .............................. 2004-112898

(51) Int. Cl.
*H05B 33/04* (2006.01)

(52) U.S. Cl. .................. 430/314; 430/319; 430/321; 445/24; 313/498

(58) Field of Classification Search .................. None
See application file for complete search history.

(56) References Cited

U.S. PATENT DOCUMENTS 6,288,486 B1  9/2001  Tsuruoka et al.

2003/0068583 A1*  4/2003  Okunaka et al. ............ 430/319
2003/0143339 A1  7/2003  Kobayashi

FOREIGN PATENT DOCUMENTS

JP  2001-237075 A  *  8/2001
JP  2002-055221  2/2002

* cited by examiner

*Primary Examiner*—John A. McPherson
(74) *Attorney, Agent, or Firm*—Burr & Brown

(57) ABSTRACT

Disclosed are a light emitting element that, in the formation of a plurality of luminescent layers, can effectively suppress color mixing in each luminescent layer and loss in dissolution of the luminescent layer per se, and a process for producing the same. The light emitting element comprising a plurality of luminescent layers formed by photolithography is produced by a process which comprises: forming a first electrode on a surface of a base material; forming a first luminescent layer on the first electrode; conducting treatment for rendering the first luminescent layer in its exposed area insoluble in a coating liquid for second luminescent layer formation; forming the second luminescent layer on the first electrode; repeating the steps a plurality of times to form a plurality of luminescent layers on the first electrode; and forming a second electrode on the plurality of luminescent cent layers.

19 Claims, 3 Drawing Sheets

(a)

(b)

(c)

(f)

(j)

(d)

(g)

(k)

(e)

(h)

(l)

(X)

(i)

(m)

(A)

(Y)

(n)

(B)

LIGHT EMITTING ELEMENT AND PROCESS FOR PRODUCING THE SAME

RELATED APPLICATION

This application is a patent application claiming the benefit of priority based on Japanese Patent Application No. 112898/2004, the entire disclosures of which are incorporated herein by reference.

BACKGROUND OF THE INVENTION

1. Technical Field

The present invention relates to a light emitting element and a process for producing the same.

2. Background Art

Light emitting elements, particularly electroluminescent elements (hereinafter often referred to as "EL element") which are field-effect light emitting elements, can realize high-intensity luminescence at a low applied voltage and further have high durability and high service life and thus are utilized in displays and the like.

In the production of a light emitting element, a luminescent layer should be formed by patterning of one or a plurality of luminescent materials. A vacuum deposition method, an ink jet printing method or photolithography and the like have been proposed as a method for luminescent layer pattern formation using a luminescent material.

Unlike the vapor deposition requiring the use of a vacuum apparatus provided with a high-accuracy alignment mechanism and the ink jet printing requiring partitions indispensable to patterning, pretreatment of a base material, an ink jet recording layer and the like, the photolithography requires none of these treatments and equipment and can form luminescent layers relatively easily at a low cost. In particular, the photolithography, as compared with the vapor deposition and the ink jet printing, has received attention as a method that can enhance luminescence efficiency of the luminescent layer and the light take-out efficiency to realize high-definition pattern formation.

An example of a method for forming a plurality of luminescent layers (for example, luminescent layers for RGB color mixture) by conventional photolithography is proposed, for example, in Japanese Patent Laid-Open No. 170673/2002. This method will be described with reference to FIG. 1. FIG. 1 is a process diagram showing a method for forming a plurality of luminescent layers by conventional photolithography. This method starts with step (a) and ends with step (n).

A coating liquid for a luminescent layer is coated onto a substrate (FIG. 1(a)), and a photoresist layer is stacked onto the coating (FIG. 1(b)). Next, only an area where the first luminescent layer is to formed is masked with a photomask, and the other area is exposed to ultraviolet light (FIG. 1(c)). The assembly is developed with a photoresist developing solution and is then washed to remove the photoresist layer in its exposed area (FIG. 1(d)). Further, the coating layer in its areas on which the photoresist layer is not stacked is removed by etching or the like to provide a luminescent layer with the photoresist layer stacked thereon (FIG. 1(e)). The above steps are further repeated twice (FIG. 1(f) to (m)), whereby patterning of three kinds of luminescent layers (luminescent layers for RGB color mixture) can be carried out. Finally, the individual photoresist layers are stripped with a photoresist stripping liquid to form three types of luminescent layers (FIG. 1(n)).

In FIG. 1, step (f) and step (j) are steps in which a coating liquid for a luminescent layer is coated to form a coating and a photoresist layer is formed onto the coating. In steps (g) to (i) and steps (k) to (m), respectively, the second luminescent layer and the third luminescent layer are patterned, and these steps are the same as steps (c) to (e).

In the above-described conventional photolithography, however, in forming a plurality of luminescent layers, for example, as shown in FIG. 1, when the formation of the first luminescent layer (FIG. 1(e)) is followed by coating of a coating liquid for second luminescent layer formation (FIG. 1(f)), the first luminescent layer in its exposed area is eluted into the coating liquid for second luminescent layer formation and, consequently, this sometimes causes color mixing or thinning down of pixels.

Accordingly, the development of photolithography, which can reduce color mixing or thinning down of pixels and can rapidly form a plurality of luminescent layers at a low cost, has been desired.

SUMMARY OF THE INVENTION

The present inventors have now found that, in forming a plurality of luminescent layers by photolithography, insolubilization treatment for rendering the first luminescent layer in its exposed area insoluble in a coating liquid for second luminescent layer formation can realize the production of a light emitting element comprising a plurality of luminescent layers that does not cause color mixing between the first luminescent layer and the second luminescent layer and can effectively prevent loss in dissolution of the first luminescent layer per se.

The present invention has been made based on such finding. Accordingly, an object of the present invention is to provide a light emitting element that, in forming a plurality of luminescent layers, has effectively suppressed color mixing between the first luminescent layer and the second luminescent layer and loss in dissolution of the luminescent layer per se, and a process for producing the same.

First Aspect of Invention

According to a first aspect of the present invention, there is provided a process for producing a light emitting element comprising a plurality of luminescent layers formed by photolithography, said process comprising the steps of:

forming a first electrode on a surface of a base material;

forming a first luminescent layer on said first electrode;

conducting treatment for rendering said first luminescent layer in its exposed area insoluble in a coating liquid for second luminescent layer formation;

forming said second luminescent layer on said first electrode;

repeating said steps a plurality of times to form a plurality of luminescent layers on said first electrode; and forming a second electrode on said plurality of luminescent layers.

Second Aspect of Invention

According to the second aspect of the present invention, there is provided a process for producing a light emitting element comprising a plurality of luminescent layers formed by photolithography, said process comprising the steps of:

forming a first electrode on a surface of a base material;

coating a coating liquid for first luminescent layer formation onto said first electrode to form a coating layer;

coating a coating liquid for a photoresist onto said coating layer to form a photoresist layer;

pattern-wise exposing said photoresist layer and developing said exposed photoresist layer for patterning so that said photoresist layer remains unremoved in areas where said first luminescent layer is to be formed;

removing said coating layer part except for parts where said photoresist layer remains unremoved on said coating layer to form said first luminescent layer with said photoresist layer remaining unremoved;

conducting treatment for rendering said first luminescent layer in its exposed area insoluble in a coating liquid for second luminescent layer formation;

forming said second luminescent layer on said first electrode in the same manner as in said first luminescent layer;

repeating said steps a plurality of times to form a plurality of luminescent layers on said first electrode;

removing the individual photoresist layers remaining unremoved on the respective luminescent layers; and forming a second electrode on the surface of said plurality of luminescent layers.

Third Aspect of Invention

According to the third aspect of the present invention, there is provided a process for producing a light emitting element comprising a plurality of luminescent layers formed by photolithography, said process comprising the steps of:

forming a first electrode on a surface of a base material;

coating a coating liquid for first luminescent layer formation onto said first electrode to form a coating layer;

coating a coating liquid for a photoresist onto said coating layer to form a photoresist layer;

pattern-wise exposing said photoresist layer and developing said exposed photoresist layer for patterning so that said photoresist layer remains unremoved in areas where said first luminescent layer is to be formed;

removing said coating layer part except for parts where said photoresist layer remains unremoved on said coating layer to form said first luminescent layer on which said photoresist layer remains unremoved;

removing said photoresist layer remaining unremoved to form said first luminescent layer;

conducting treatment for rendering said first luminescent layer in its exposed area insoluble in a coating liquid for second luminescent layer formation;

forming said second luminescent layer on said first electrode in the same manner as in said first luminescent layer;

repeating said steps a plurality of times to form a plurality of luminescent layers on said first electrode; and forming a second electrode on the surface of said plurality of luminescent layers.

Figure 1:
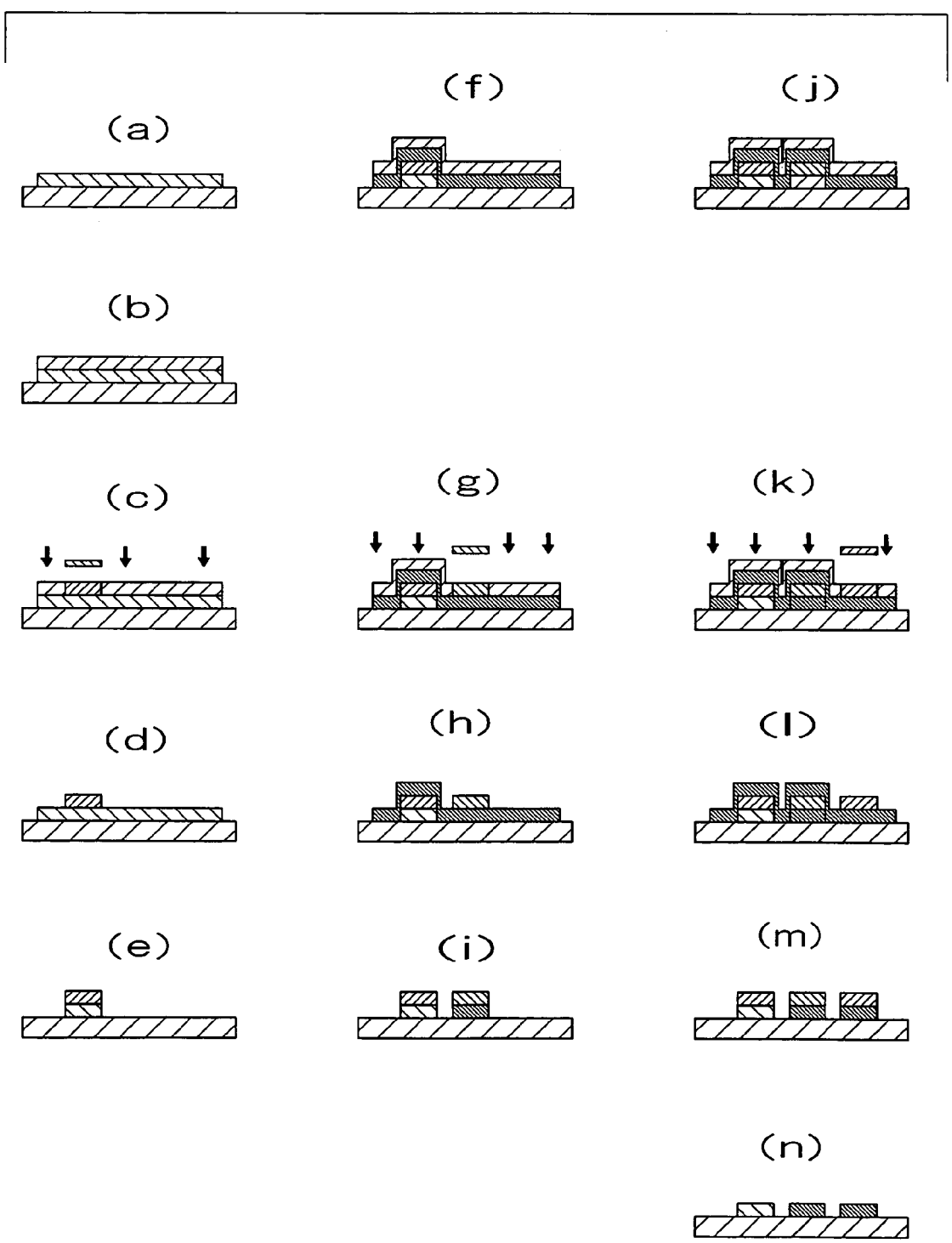
FIG. 1 is a process diagram of a method for forming a plurality of luminescent layers by conventional photolithography.

DESCRIPTION OF REFERENCE CHARACTERS (a): coating of coating liquid for one (first) luminescent layer formation, (b): coating of resist, (c): exposure, (d): development, (e): removal, (f): coating of coating liquid for another (second) luminescent layer formation and coating of resist, (g): exposure, (h): development, (i): removal, (j): coating of coating liquid for third luminescent layer formation and coating of resist, (k): exposure, (l): development, (m): removal, (n): stripping, (A): protection, (B): protection, (X): stripping, and (Y): stripping.

DETAILED DESCRIPTION OF THE INVENTION

First Aspect of Invention

The process for producing a light emitting element according to the first aspect of the present invention involves, in forming a plurality of luminescent layers by photolithography, the step of forming a first luminescent layer on a first electrode; the step of conducting treatment for rendering said first luminescent layer in its exposed area insoluble in a coating liquid for second luminescent layer formation; the step of forming said second luminescent layer on said first electrode; the step of repeating said steps a plurality of times to form a plurality of luminescent layers on said first electrode; and the step of forming a second electrode on said plurality of luminescent layers.

Insolubilization Treatment

In the present invention, insolubilization of each luminescent layer in its exposed area can be carried out by any method so far as the first luminescent layer can be rendered insoluble in a coating liquid for second luminescent layer formation. Preferred is plasma treatment. The plasma treatment is preferably carried out using a fluoride-containing gas. Specific examples of fluorinating gases include fluorocarbons (preferably methane tetrafluoride) and sulfur hexafluoride.

The plasma treatment can be carried out by using a conventional plasma generation treatment apparatus or a dry etching apparatus. In the plasma treatment using the fluorinating gas, organic matter on the substrate is chemically reacted with the fluorinating gas to form a fluorinated film on the surface.

In carrying out the plasma treatment, the kind and flow rate of a reactive gas (for example, methane tetrafluoride), the pressure within a vacuum chamber, and the treatment time are optimized. For example, a sample is installed within a vacuum chamber, and the chamber is then brought to an internal pressure of 50 mTorr and a flow rate of a fluorocarbon gas (for example, methane tetrafluoride) of 100 sccm which are then stabilized. Thereafter, treatment is carried out at a power of 500 W for 10 min to complete the insolubilization treatment. In this case, the use of an atmospheric plasma apparatus, which does not require the use of any vacuum chamber, is preferred. The use of atmospheric plasma can realize plasma treatment under atmospheric pressure without the need to use any vacuum apparatus and can shorten the treatment time and reduce the cost.

In a preferred embodiment of the present invention, one or at least two groups selected from the group consisting of CF, $CF_2$, $CF_3$, CHF, $CHF_2$, $CH_2F$, and CC bond groups, preferably $CF_2$, $CF_3$, and CHF groups, is introduced into the surface of the luminescent layers by the plasma treatment using the fluoride, whereby the individual luminescent layers in their exposed areas are insolubilized.

In the present invention, preferably, the individual photoresist layers are formed so as to be insoluble in the respective coating liquids for luminescent layer formation. The insolubilization of the photoresist layer may be carried out by insolubilizing the photoresist layer per se formed on the luminescent layer. This insolubilization treatment may be carried out in the same manner as in the insolubilization treatment of the luminescent layer. Coating liquids for photoresists for the formation of the respective photoresist layers may be prepared to have compositions which are insoluble in coating liquids for the formation of the respective luminescent layers.

Removal (Etching)

In the present invention, each luminescent layer in its unnecessary coating layer parts or each buffer layer in its unnecessary coating layer parts are removed. One example of the removal method is a method called the so-called "etching." Specific examples of etching methods include a wet method using a solvent or the like and a dry method not using the solvent or the like (a dry etching method). Preferred is a dry etching method characterized by anisotropy. Among others, a reactive ion etching method is preferred.

In the reactive ion etching method, an organic material is chemically reacted and converted to a compound having a smaller molecular weight which is volatilized or vaporized to remove the unnecessary coating layer from the top of the substrate. The reactive ion etching method is advantageous in that the etching accuracy is high and the process can be carried out in a short time.

In the present invention, preferably, the dry etching treatment is carried out using an oxygen gas or an oxygen atom-containing gas. The use of these gases is advantageous in that the luminescent layer can be oxidized to decompose and remove the luminescent layer and, in addition, unnecessary undesired substances can be removed from the top of the substrate. Further, in this dry etching treatment, etching of a transparent conducting layer of an oxide such as ITO is not conducted. Therefore, advantageously, the surface of the electrode can be cleaned without sacrificing electrode characteristics.

The dry etching treatment is preferably carried out using atmospheric plasma. When the atmospheric plasma is used, the dry etching usually requiring the use of a vacuum apparatus can be carried out under atmospheric pressure. This can shorten the treatment time and can reduce the cost. In this case, etching can utilize oxidative decomposition of a luminescent material constituting the luminescent layer by oxygen in the plasmatized atmosphere. However, the gas composition of the reactive atmosphere used may be regulated as desired by gas replacement and circulation.

Light Emitting Element

The production process of the present invention can produce a light emitting element having the following construction.

1. Base Material

The base material is used as a lower surface of the first electrode and as such is preferably transparent. Specific examples of base materials include base materials of quartz, glass, silicon wafers, and glass with TFT (thin-film transistor) formed thereon, or polymeric base materials of polycarbonate (PC), polyethylene terephthalate (PET), polybutylene terephthalate (PBT), polyphenylene sulfide (PPS), polyimide (PI), polyamide-imide (PAI), polyether sulfone (PES), polyetherimide (PEI), polyetherether ketone (PEEK) and the like. Among them, quartz, glass, silicon wafers, or polymeric base materials of polyimide (PI), polyamide-imide (PAI), polyether sulfone (PES), polyether imide (PEI), polyetherether ketone (PEEK) and the like are particularly preferred. The thickness of the base material is about 0.1 to 2.0 mm.

2. First Electrode

The material for the first electrode may be a metallic material, an organic material, an inorganic material, or a composite material thereof. Among them, a metallic material is preferred. Specific examples of metallic materials include chromium, nickel, tungsten, manganese, indium, tin, zinc, aluminium, gold, silver, tantalum, platinum, palladium, molybdenum, niobium, a combination of two or more of the above metals, alloys composed mainly of these metals, or a combination of the above metallic materials. The metallic material is preferably selected from the group consisting of chromium, nickel, tungsten, manganese, indium, tin, and zinc.

In a preferred embodiment of the present invention, the metal layer comprises a laminate of one or more alloys and one or more metals or alloys. The alloy particularly preferably has excellent heat resistance and corrosion resistance, and examples of such alloys include Cr-base alloys (for example, Cr—Al—Mn—Si alloy and Cr—Mn—C—Si alloy) and Ni—Cr-base alloys (for example, Cr—Ni—C—Mn alloy, Cr—Ni—Mn—Si alloy, Cr—Ni—Mo—Mn alloy, Cr—Ni—Ti—Mn alloy, Cr—Ni—Ta—Mn alloy, and Cr—Ni—Cu—C alloy). Alloys comprising nickel, titanium, tantalum, and zirconium include Ti-base alloys (for example, Ti—Al—Sn alloy, Ti—Mn alloy, and Ti—Al—V alloy), and Zr—Ni-base alloys (for example, Zr—Sn—Fe alloy, Zr—Sn—Fe—Cr alloy, Ni—Cr—Fe—Ti alloy, Ni—Cr—Mo—Fe alloy, Ni—Cu—Fe alloy, Ni—Cr—Fe alloy, and Ni—Mn—Al—Si alloy). Further, amorphous metal alloys may also be preferably used. Specific examples of amorphous metal alloys include metal-semimetal (metal: e.g., Fe (iron), Co (cobalt), Ni (nickel), Nb (niobium), semimetal: e.g., P (phosphorus), B (boron), Si (silicon)) amorphous alloys and metal-metal (e.g., Fe—Zr, La—Cu, U—Co, and Ca—Al) amorphous alloys.

Methods for forming the metal layer as the first electrode on the base material include sputtering, vacuum heat deposition, EB deposition, and ion plating.

3. Luminescent Layer

The luminescent material for luminescent layer formation may be any inorganic luminescent material or organic luminescent material. In the present invention, if necessary, a dopant may be added. The dopant is added to the luminescent layer, for example, for improving luminescence efficiency or changing luminescence wavelength. The thickness of the luminescent layer may be 2 to 200 nm.

Inorganic Luminescent Material

Specific examples of colorant materials include zinc sulfide type phosphors (for example, ZnS:Mn, ZnS:Tb, Zn—Mg—S:Mn), strontium sulfide type phosphors (for example, SrS:Ce), calcium sulfide type phosphors (for example, CaS:Eu), and barium sulfide type phosphors (for example, Ba—Al—S:Eu). Metal indicated after ": (colon)" in the exemplified inorganic luminescent material refers to a dopant.

Organic Luminescent Material

Organic luminescent materials include organic compounds (low-molecular compound or high-molecular compound) which emit fluorescence or phosphorescence. Specific examples of organic luminescent materials are as follows.

1) Colorant Material

Specific examples of colorant materials include cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, trifumanylamine derivatives, oxadiazole dimers, and pyrazoline dimers.

2) Metal Complex Material

Specific examples of metal complex materials include aluminum quinolinol complex, benzoquinolinol beryllium complex, benzoxazolyl zinc complex, benzothiazole zinc complex, azomethyl zinc complex, porphyrin zinc complex, europium complex, and metal complexes in which the center metal is aluminum (Al), zinc (Zn), beryllium (Be) or the like, or a rare earth metal such as terbium (Tb), europium (Eu), or dysprosium (Dy) while the ligand is oxadiazole, thiadiazole, phenylpyridine, phenylbenzoimidazole, quinoline or other structures.

3) Polymeric Material

Specific examples of polymeric materials include poly-p-phenylenevinylene derivatives, polythiophene derivatives, poly-p-phenylene derivatives, polysilane derivatives, polyacetylene derivatives, polyfluorene derivatives, polyvinylcarbazole derivatives, and polymers prepared by polymerizing the above colorants or metal complex materials.

In the present invention, specific examples of blue emitting materials among the above luminescent materials include distyrylarylene derivatives, oxadiazole derivatives and polymers thereof, polyvinylcarbazole derivatives, poly-p-phenylene derivatives, and polyfluorene derivatives, preferably polyvinylcarbazole derivatives, poly-p-phenylene derivatives, and polyfluorene derivatives. Specific examples of green emitting materials include quinacridone derivatives, coumarin derivatives, and polymers thereof, poly-p-phenylenevinylene derivatives and polyfluorene derivatives, preferably poly-p-phenylenevinylene derivatives and polyfluorene derivatives. Specific examples of red emitting materials include coumarin derivatives, thiophene ring compounds, and polymers thereof, poly-p-phenylenevinylene derivatives, polythiophene derivatives, and polyfluorene derivatives, preferably poly-p-phenylenevinylene derivatives, polythiophene derivatives, and polyfluorene derivatives.

Dopant

Dopants may be added to the luminescent layer, e.g., for improving luminescence efficiency or changing luminescence wavelength. Such dopants may be the same as those described above in connection with the inorganic luminescent material. Organic luminescent materials include, for example, perylene derivatives, coumarin derivatives, rubrene derivatives, quinacridone derivatives, squalium derivatives, porphyrin derivatives, styryl dyes, tetracene derivatives, pyrazolone derivatives, decacyclene, and phenoxazone.

4. Second Electrode

The second electrode may be as described in connection with the first electrode layer. When any one of the first and second electrodes is a positive electrode, the other electrode is a negative electrode.

5. Optional Layer

The light emitting element according to the present invention basically comprises a base material, a first electrode, a luminescent layer, and a second electrode. The light emitting element may further comprise the following optional layers.

1) Buffer layer

The light emitting element according to the present invention may comprise a buffer layer, preferably between the first electrode and the luminescent layers or between the luminescent layers and the second electrode. In the present invention, the buffer layer is a layer which is formed so as to facilitate charge injection into the luminescent layer. This layer contains an organic material, particularly an organic conductor or the like. For example, the buffer layer may be formed of an electrically conductive polymer which can enhance the efficiency of hole injection into the luminescent layer and can flatten concaves and convexes on the surface of the electrode or the like.

Specific examples of materials for forming the buffer layer include polymers of hole transport materials such as polyalkylthiophene derivatives, polyaniline derivatives, and triphenyl amine, sol-gel films of inorganic compounds, films of polymers of organic materials such as trifluoromethane, and organic compound films containing Lewis acid.

Methods usable for buffer layer formation include a method using vapor deposition or other electrodeposition of the material for forming the buffer layer, or a coating method using a melt, solution or mixed liquid of the material, such as spin coating, casting, dipping, bar coating, blade coating, roll coating, gravure coating, flexo printing, or spray coating. When the buffer layer has high electrical conductivity, preferably, patterning is carried out so that crosstalk is prevented while maintaining diode characteristics of the element. The thickness of the buffer layer is usually about 10 to 200 nm.

2) Insulating Layer

The light emitting element according to the present invention may comprise an insulating layer, preferably provided on an edge part of the first electrode patterned on the base material and on a nonluminescent part of the light emitting element. In the formation of the insulating layer, the insulating layer may previously be provided so that the luminescent part is in an opening form. The formation of the insulating layer can suppress the formation of defects, e.g., by shortcircuiting of the light emitting element and can provide a light emitting element which has long service life and can stably emit light.

The insulating layer may be patterned using, for example, an ultraviolet-curable resin or the like in a thickness of about 1 μm. In the present invention, when the luminescent layer or the like is patterned by dry etching, preferably, the insulating layer has resistance to dry etching. When the resistance to dry etching is low, preferably, the insulating layer is formed in a thickness of not less than 1 μm, preferably approximately not less than 1.5 μm and not more than 10 μm, to prevent the occurrence of defects caused by dry etching.

Second Aspect of Invention

The production process of a light emitting element according to the present invention will be described with reference to FIGS. 1 and 2. FIG. 2 is a diagram showing one process in the production process according to the second aspect of the present invention.

Figure 2:
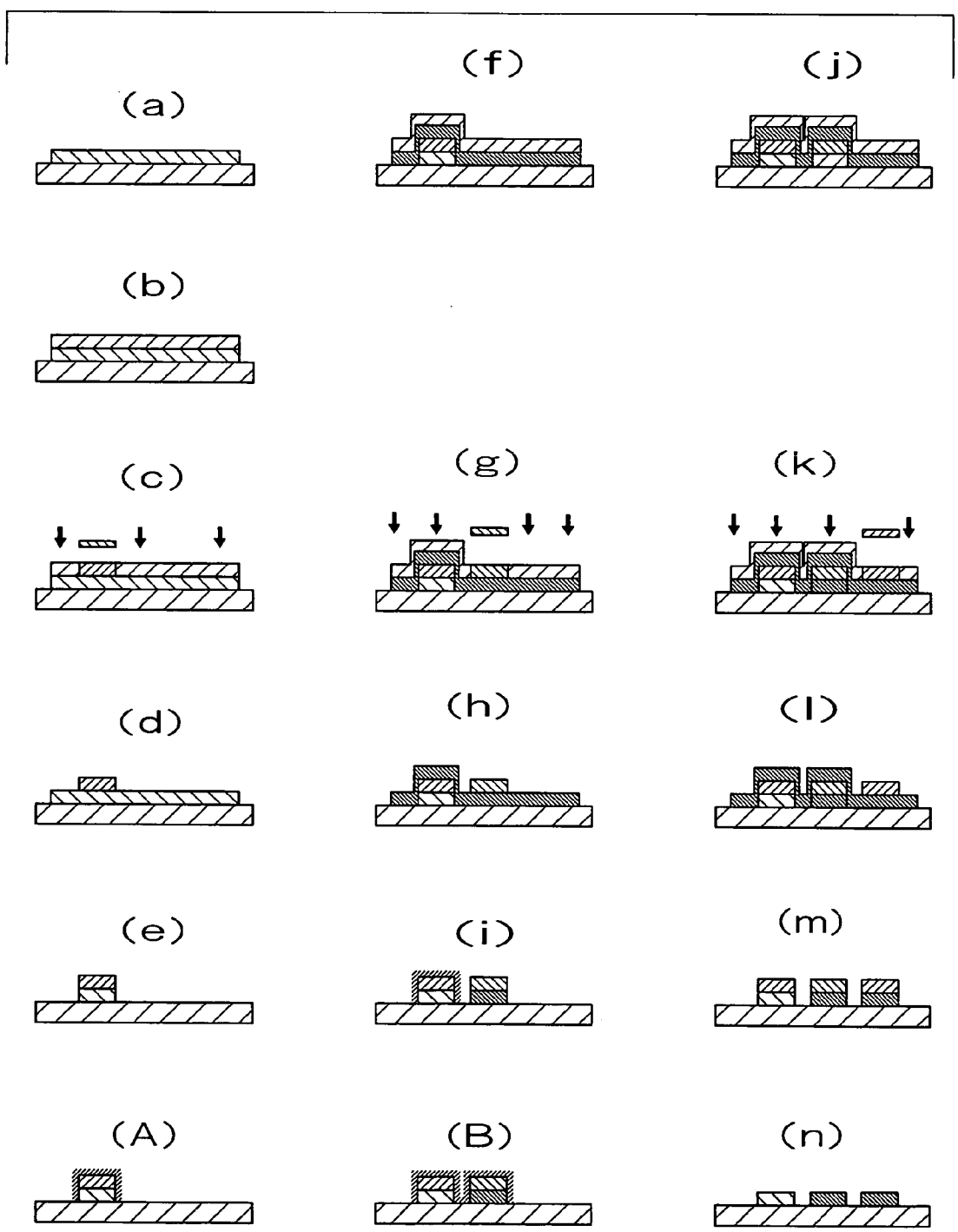
FIG. 2 is a process diagram of the production process according to the present invention.

The production process according to the present invention includes step (A) and step (B) not involved in a process diagram shown in FIG. 1 (FIG. 2). Specifically, in the production process according to the present invention, as shown in the process diagram shown in FIG. 2, treatments from steps (a) to (d) in FIG. 2 are carried out. Next, the coating layer part except for its part on which the photoresist layer remains unremoved is removed to form the first luminescent layer with the photoresist layer remaining unremoved (FIG. 2(e)), the first luminescent layer (optionally the photoresist layer) in its exposed area is then rendered insoluble in a coating liquid for second luminescent layer formation (FIG. 2(A)).

Further, in forming the third luminescent layer, after the formation of the second luminescent layer on which the photoresist layer remains unremoved (FIG. 2(i)), the second luminescent layer (optionally the photoresist layer) in its exposed area is rendered insoluble in a coating liquid for third luminescent layer formation (FIG. 2(B)). In a preferred embodiment of the present invention, in step (B) in FIG. 2, treatment is preferably carried out in which the first luminescent layer with the photoresist layer remaining unremoved (optionally photoresist layer) in its exposed area is further rendered insoluble in a coating liquid for third luminescent layer formation (FIG. 2(B)). Steps (a) to (n) in FIG. 2 may be the same as those in FIG. 1.

The construction other than the above construction may be the same as described above in connection with the first embodiment of the present invention.

Third Aspect of Invention

Figure 3:
FIG. 3 is a process diagram of the production process according to the present invention.
Figure 3:
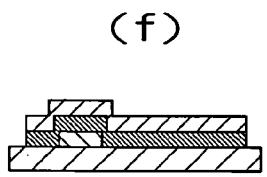
Figure 3:
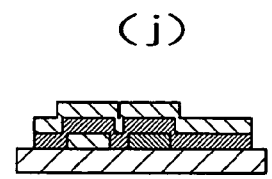
Figure 3:
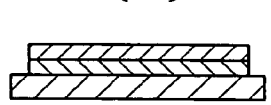
Figure 3:
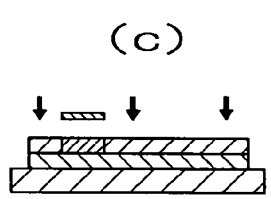
Figure 3:
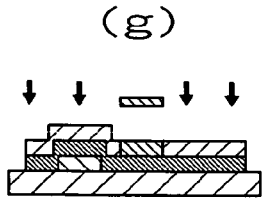
Figure 3:
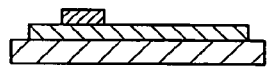
Figure 3:
Figure 3:
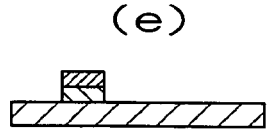
Figure 3:
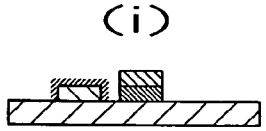
Figure 3:
Figure 3:
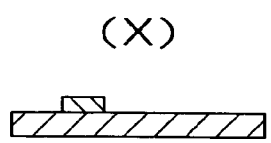
Figure 3:
Figure 3:
Figure 3:
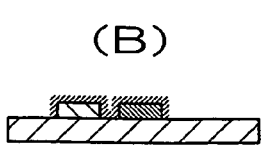

The production process of a light emitting element according to the present invention will be described with reference to FIGS. 1 and 3. FIG. 3 is a diagram showing one process in the production process according to the third aspect of the present invention.

The production process according to the present invention includes steps (X) and (A) and steps (Y) and (B) not involved in a process diagram shown in FIG. 1 (FIG. 3). Specifically, in the production process according to another aspect of the present invention, as shown in the process diagram shown in FIG. 3, treatments from steps (a) to (d) in FIG. 3 are carried out. Next, the coating layer part, except for its part on which the photoresist layer remains unremoved is removed to form the first luminescent layer with the photoresist layer remaining unremoved (FIG. 3(e)). The remaining photoresist layer is removed to form the first luminescent layer (FIG. 3(X)). The first luminescent layer in its exposed area is then rendered insoluble in a coating liquid for second luminescent layer formation (FIG. 3(A)). Further, in forming the third luminescent layer, the formation of the second luminescent layer on which the photoresist layer remains unremoved (FIG. 3(i)), the remaining photoresist layer is removed to form the second luminescent layer (FIG. 3(Y)), and the second luminescent layer in its exposed area is then rendered insoluble in a coating liquid for third luminescent layer formation (FIG. 3(B)). In a preferred embodiment of the present invention, in step (B) in FIG. 3, treatment is preferably carried out in which the first luminescent layer in its exposed area is further rendered insoluble in a coating liquid for third luminescent layer formation (FIG. 3(B)). Steps (a) to (n) in FIG. 3 may be the same as those in FIG. 1.

The construction other than the above construction may be the same as described above in connection with the first embodiment of the present invention.

Light Emitting Element

According to another aspect of the present invention, there is provided a light emitting element. The light emitting element comprises: a base material; and a first electrode, a plurality of luminescent layers, and a second electrode provided in that order on said base material, wherein in said plurality of luminescent layers, said first luminescent layer has been rendered insoluble in a coating liquid for second luminescent layer formation.

The light emitting element according to the present invention is preferably produced by the production process according to the present invention. According to the present invention, the light emitting element may be an electroluminescent element.

The members for forming the light emitting element may be the same as those described above in connection with the first aspect of the present invention.

EXAMPLES

The following Example and Comparative Example further illustrate the present invention but are not intended to limit it.

Example 1

Preparation of EL Element

Formation of First Luminescent Layer
Formation of First Buffer Layer

A 6-inch square patterned ITO substrate with a sheet thickness of 1.1 mm was cleaned and used as a base material and a first electrode layer. A coating liquid (Bayer; Baytron P) (0.5 ml) for a buffer layer was dropped on a center part of the substrate for spin coating (while holding at 2500 rpm for 20 sec) to form a buffer layer. The buffer layer had a thickness of 80 nm.

Formation of First Luminescent Layer

A coating liquid (70 parts by weight of polyvinylcarbazole, 30 parts by weight of oxadiazole, 1 part by weight of dicyanomethylene pyran derivative, and 4900 parts by weight of monochlorobenzene) which is a red luminescent organic material (1 ml) was placed on the buffer layer and was dropped on a center part of the substrate for spin coating (while holding at 2000 rpm for 10 sec) to form a first luminescent layer. The first luminescent layer had a thickness of 80 nm.

A positive-working photoresist liquid (manufactured by Tokyo Ohka Kogyo Co., Ltd.; OFPR-800) (2 ml) was dropped on a center part of the substrate for spin coating (while holding at 500 rpm for 10 sec and then holding at 2000 rpm for 20 sec) to form a coating. The coating had a thickness of about 1 μm. Prebaking was carried out at 80° C. for 30 min. Thereafter, the assembly, together with an exposure mask, was set in an alignment exposure machine, and ultraviolet light was applied to a luminescent layer part to be removed except for the first luminescent layer. Development was carried out with a resist developing solution (manufactured by Tokyo Ohka Kogyo Co., Ltd.; NMD-3) for 20 sec, followed by washing with water to remove the photoresist layer in its exposed areas. Post-baking was carried out at 120° C. for 30 min. The buffer layer and the luminescent layer in its parts from which the photoresist layer had been removed was then removed by reactive ion etching using oxygen plasma.

Insolubilization Treatment of First Luminescent Layer

The substrate thus obtained was subjected to plasma treatment using methane tetrafluoride under conditions of power 500 W, gas flow rate 100 sccm, chamber internal pressure 50 mTorr to fluorinate the surface of the organic layer and thus to render the organic layer insoluble in a solution which will be subsequently used.

Formation of Second Luminescent Layer
Formation of Second Buffer Layer

A coating liquid (Bayer; Baytron P) (0.5 ml) for a buffer layer was dropped on a center part of the substrate for spin coating (while holding at 2500 rpm for 20 sec) to form a buffer layer. The buffer layer had a thickness of 80 nm.

Formation of Second Luminescent Layer

A coating liquid (70 parts by weight of polyvinylcarbazole, 30 parts by weight of oxadiazole, 1 part by weight of coumarin 6, and 4900 parts by weight of monochlorobenzene) which is a green luminescent organic material (1 ml) was placed on the buffer layer and was dropped on a center part of the substrate for spin coating (while holding at 2000 rpm for 10 sec) to form a second luminescent layer. The second luminescent layer had a thickness of 80 nm.

A positive-working photoresist liquid (manufactured by Tokyo Ohka Kogyo Co., Ltd.; OFPR-800) (2 ml) was dropped on a center part of the substrate for spin coating (while holding at 500 rpm for 10 sec and then holding at 2000 rpm for 20 sec) to form a coating. The coating had a thickness of about 1 µm. Prebaking was carried out at 80° C. for 30 min. Thereafter, the assembly, together with an exposure mask, was set in an alignment exposure machine, and ultraviolet light was applied to a luminescent layer part to be removed except for the first luminescent layer and the second luminescent layer. Development was carried out with a resist developing solution (manufactured by Tokyo Ohka Kogyo Co., Ltd.; NMD-3) for 20 sec, followed by washing with water to remove the photoresist in its exposed areas. Post-baking was carried out at 120° C. for 30 min. The buffer layer and the luminescent layer in its parts from which the photoresist layer had been removed was then removed by reactive ion etching using oxygen plasma.

Insolubilization Treatment of Second Luminescent Layer

The substrate thus obtained was subjected to plasma treatment using methane tetrafluoride under conditions of power 500 W, gas flow rate 100 sccm, chamber internal pressure 50 mTorr to fluorinate the surface of the organic layer and thus to render the organic layer insoluble in a solution which will be subsequently used.

Formation of Third Luminescent Layer

Formation of Third Buffer Layer

A coating liquid (Bayer; Baytron P) (0.5 ml) for a buffer layer was dropped on a center part of the substrate for spin coating (while holding at 2500 rpm for 20 sec) to form a buffer layer. The buffer layer had a thickness of 800 angstroms.

Formation of Third Luminescent Layer

A coating liquid (70 parts by weight of polyvinylcarbazole, 30 parts by weight of oxadiazole, 1 part by weight of perylene, and 4900 parts by weight of monochlorobenzene) which is a blue luminescent organic material (1 ml) was placed on the buffer layer and was dropped on a center part of the substrate for spin coating (while holding at 2000 rpm for 10 sec) to form a third luminescent layer. The third luminescent layer had a thickness of 80 nm.

A positive-working photoresist liquid (manufactured by Tokyo Ohka Kogyo Co., Ltd.; OFPR-800) (2 ml) was dropped on a center part of the base body for spin coating (while holding at 500 rpm for 10 sec and then holding at 2000 rpm for 20 sec) to form a coating. The coating had a thickness of about 1 µm. Prebaking was carried out at 80° C. for 30 min. Thereafter, the assembly, together with an exposure mask, was set in an alignment exposure machine, and ultraviolet light was applied to a luminescent layer part to be removed except for the first luminescent layer, the second luminescent layer and the third luminescent layer. Development was carried out with a resist developing solution (manufactured by Tokyo Ohka Kogyo Co., Ltd.; NMD-3) for 20 sec, followed by washing with water to remove the photoresist in its exposed areas. Post-baking was carried out at 120° C. for 30 min. The buffer layer and the luminescent layer in its parts from which the photoresist layer had been removed was then removed by reactive ion etching using oxygen plasma. Thus, a base body comprising the first, second and third luminescent layers protected by the photoresist was prepared. Thereafter, the whole photoresist was removed with acetone to expose the patterned luminescent layers.

After drying at 100° C. for one hr, on the base body, calcium was vapor deposited in a thickness of 50 nm as a second electrode layer, and silver was vapor deposited in a thickness of 250 nm as a protective layer to prepare an EL light emitting element.

Comparative Example 1

An EL light emitting element was prepared in the same manner as in Example 1, except that methane tetrafluoride was used and plasma treatment was not carried out.

Evaluation Test

For EL light emitting elements prepared in Examples 1 and Comparative Example 1 were evaluated as follows. The results are shown in Table 1.

Evaluation 1: Elution/Color Mixing Evaluation Test for each Layer

In the production process of the EL light emitting elements prepared in Example 1 and Comparative Example 1, when the material for the buffer layer and the luminescent material were coated, evaluation was carried out for the elution of the materials and the color mixing according to the following criteria.

Evaluation Criteria

◯: Neither elution of material nor color mixing was observed.

Δ: Elution of material and color mixing were slightly observed on a level that did not pose a problem of the product.

×: Elution of material and color mixing were observed on a significant level.

Evaluation 2: Evaluation Test on Luminescence Characteristics

For the EL light emitting elements prepared in Example 1 and Comparative Example 1, the ITO electrode side was connected to a positive electrode, and the silver electrode side was connected to a negative electrode. A direct current was applied with a source meter. Upon the application of 10 V, luminescence was visually observed from each of the first luminescent layer, the second luminescent layer, and the third luminescent layer, and the luminescence characteristics were evaluated according to the following criteria.

Evaluation Criteria

◯: For all the luminescent layers, the luminescence characteristics were satisfactory.

Δ: For a part of the luminescent layers, the luminescence characteristics were unsatisfactory on a level that did not pose a problem of the product.

×: For all the luminescent layers, the luminescence characteristics were unsatisfactory.

Evaluation 3: Evaluation Test on Insolubilization

To evaluate Example 1 and Comparative Example 1, two assemblies each prepared by coating a coating liquid for a luminescent layer onto a base material and patterning the coating were provided. One of the assemblies was subjected to plasma treatment using methane tetrafluoride to prepare a sample of Example 1, and the other assembly was not subjected to any treatment and was used as a sample of Comparative Example 1. The plasma treatment was carried out under conditions of power 500 W, flow rate 100 sccm, and chamber internal pressure 50 mTorr. The samples thus obtained were analyzed by XPS under the following conditions. The results are shown in Table 1 below.

Conditions for XPS
Apparatus: ESCALAB 220i-XL (manufactured by Thermo-VG)
X-ray source: Monochromated Al Kα (monochromatized X-rays)
X-ray output: 10 kV·18 mA (180 W)
Lens: Large Area XL
Photoelectron escape angle: 90 degrees

TABLE 1

| Ex./ | Evaluation 1 | Evaluation 2 | Carbon atom | Nitrogen atom | Oxygen atom | Fluorine atom |
|---|---|---|---|---|---|---|
| | | | Evaluation 3 | | | |
| Ex. 1 | ◯ | ◯ | 62.0 | 0.9 | 2.7 | 34.4 |
| Comp. Ex. 1 | X | X | 72.7 | 1.1 | 13.8 | 0.0 |

The invention claimed is:

1. A process for producing a light emitting element comprising a plurality of luminescent layers formed by photolithography, said process comprising the steps of:
   forming a first electrode on a surface of a base material;
   forming a first luminescent layer on said first electrode;
   conducting treatment for rendering only the surface of said first luminescent layer in its exposed area insoluble in a coating liquid for second luminescent layer formation;
   forming said second luminescent layer on said first electrode;
   repeating said steps a plurality of times to form a plurality of luminescent layers on said first electrode; and
   forming a second electrode on said plurality of luminescent layers.

2. The process according to claim 1, wherein said plurality of luminescent layers are formed by conducting treatment for rendering said first luminescent layer in its exposed area and said second luminescent layer in its exposed area insoluble in a coating liquid for third luminescent layer formation.

3. The process according to claim 1, wherein said treatment for insolubilizing said individual luminescent layers in their exposed areas is carried out by plasma treatment.

4. The process according to claim 3, wherein said plasma treatment is carried out using a fluoride-containing gas.

5. The process according to claim 4, wherein one or at least two groups selected from the group consisting of CF, $CF_2$, $CF_3$, CHF, $CHF_2$, $CH_2F$, and CC bond groups has been introduced into the surface of each of the luminescent layers by said plasma treatment using said fluoride.

6. The process according to claim 1, wherein said individual luminescent layers are insoluble in a photoresist solvent, a photoresist developing solution, and a photoresist removing solution.

7. The process according to claim 1, which further comprises the step of forming a buffer layer between said first electrode and each luminescent layer or between each luminescent layer and said second electrode.

8. The process according to claim 1, wherein said light emitting element is an electroluminescent element.

9. A light emitting element produced by the process according to claim 1.

10. A process for producing a light emitting element comprising a plurality of luminescent layers formed by photolithography, said process comprising the steps of:
   forming a first electrode on a surface of a base material;
   coating a coating liquid for first luminescent layer formation onto said first electrode to form a coating layer;
   coating a coating liquid for a photoresist onto said coating layer to form a photoresist layer;
   pattern-wise exposing said photoresist layer and developing said exposed photoresist layer for patterning so that said photoresist layer remains unremoved in areas where said first luminescent layer is to be formed;
   removing said coating layer part except for parts where said photoresist layer remains unremoved on said coating layer to form said first luminescent layer with said photoresist layer remaining unremoved;
   conducting treatment for rendering only the surface of said first luminescent layer in its exposed area insoluble in a coating liquid for second luminescent layer formation;
   forming said second luminescent layer on said first electrode in the same manner as in said first luminescent layer;
   repeating said steps a plurality of times to form a plurality of luminescent layers on said first electrode;
   removing the individual photoresist layers remaining unremoved on the respective luminescent layers; and
   forming a second electrode on the surface of said plurality of luminescent layers.

11. The process according to claim 10, wherein said photoresist layers are formed so as to be insoluble in said respective coating liquids for luminescent layer formation.

12. The process according to claim 10, wherein dry etching is used as means for removing said photoresist layers remaining unremoved on said respective luminescent layers.

13. The process according to claim 12, wherein said dry etching is reactive ion etching.

14. The process according to claim 13, wherein said dry etching treatment is carried out using an oxygen gas or an oxygen atom-containing gas.

15. The process according to claim 13, wherein said dry etching treatment is carried out using atmospheric plasma.

16. The process according to claim 10, which further comprises the step of forming a buffer layer between said first electrode and each luminescent layer or between each luminescent layer and said second electrode.

17. The process according to claim 16, wherein dry etching is used as means for removing said photoresist layers remaining unremoved on said buffer layers.

18. A process for producing a light emitting element comprising a plurality of luminescent layers formed by photolithography, said process comprising the steps of:
   forming a first electrode on a surface of a base material;
   coating a coating liquid for first luminescent layer formation onto said first electrode to form a coating layer;
   coating a coating liquid for a photoresist onto said coating layer to form a photoresist layer;
   pattern-wise exposing said photoresist layer and developing said exposed photoresist layer for patterning so that said photoresist layer remains unremoved in areas where said first luminescent layer is to be formed;
   removing said coating layer part except for parts where said photoresist layer remains unremoved on said coating layer to form said first luminescent layer with said photoresist layer remaining unremoved;

removing said photoresist layer remaining unremoved to form said first luminescent layer;

conducting treatment for rendering only the surface of said first luminescent layer in its exposed area insoluble in a coating liquid for second luminescent layer formation;

forming said second luminescent layer on said first electrode in the same manner as in said first luminescent layer;

repeating said steps a plurality of times to form a plurality of luminescent layers on said first electrode; and forming a second electrode on the surface of said plurality of luminescent layers.

19. The process according to claim 18, wherein said photoresist layers are formed so as to be insoluble in said respective coating liquids for luminescent layer formation.

* * * * *